United States Patent [19]
Shekar et al.

[11] Patent Number: 5,294,816
[45] Date of Patent: Mar. 15, 1994

[54] UNIT CELL ARRANGEMENT FOR EMITTER SWITCHED THYRISTOR WITH BASE RESISTANCE CONTROL

[75] Inventors: Mallikarjunaswamy S. Shekar; Mahalingam Nandakumar; Bantval J. Baliga, all of Raleigh, N.C.

[73] Assignee: North Carolina State University at Raleigh, Raleigh, N.C.

[21] Appl. No.: 897,456

[22] Filed: Jun. 10, 1992

[51] Int. Cl.$^5$ .................... H01L 23/48; H01L 29/74; H01L 29/76

[52] U.S. Cl. .................... 257/163; 257/768; 257/139; 257/378

[58] Field of Search ............... 257/163, 768, 139, 378

[56] References Cited

U.S. PATENT DOCUMENTS

| | | | |
|---|---|---|---|
| 4,760,431 | 6/1988 | Nakagawa et al. | 357/234 |
| 4,914,496 | 4/1990 | Nakagawa et al. | 357/38 |
| 4,928,155 | 5/1990 | Nakagawa et al. | 357/23.4 |
| 4,954,869 | 9/1990 | Bauer | 357/15 |
| 4,956,690 | 9/1990 | Kato | 357/38 |
| 4,959,703 | 9/1990 | Ogura et al. | 357/38 |
| 4,963,972 | 10/1990 | Shinohe et al. | 357/38 |
| 5,014,102 | 5/1991 | Adler | 357/23 |
| 5,086,323 | 2/1992 | Nakagawa et al. | 357/23.4 |
| 5,089,864 | 2/1992 | Sakurai | 357/23.4 |
| 5,091,766 | 2/1992 | Terashima | 357/38 |
| 5,093,701 | 3/1992 | Nakagawa et al. | 357/23.4 |
| 5,099,300 | 3/1992 | Baliga | 357/37 |

OTHER PUBLICATIONS

A new MOS-Gated Power Thyristor structure with Turn-off achieved by controlling The Base Resistance., Nandakumar et al. 1991.

The Insulated Gate Transistor: A New Three-Terminal MOS-Controlled Bipolar Power Device. Baliga et. al , 1984.

Experimental Demonstration of the Emitter Switched Thyristor Shekar et al, 1983.

The Base Resistance Controlled Thyristor (BRT) Nandakumar et al, 1991.

Characteristics of the Emitter-Switched Thyristor Shekar et al, 1991.

MOS Controlled Thyristors V.A.K. Temple, 1984.

The Insulated Gate Rectifier (IGR), Baliga et al, 1982.

A MOS-Gated Emitter Switched Thyristor Baliga, 1990.

Baliga and Chang, "The MOS Depletion-Mode Thyristor: A New MOS-Controlled Bipolar Power Device", IEEE Electron Device Letters, vol. 8, No. 8, pp. 411-413, Aug., 1988.

(List continued on next page.)

*Primary Examiner*—William L. Sikes
*Assistant Examiner*—Fetsum Abraham
*Attorney, Agent, or Firm*—Bell, Seltzer, Park & Gibson

[57] ABSTRACT

An emitter switched thyristor with base resistance control for preventing parasitic latch-up includes a P-N-P-N main thyristor with an N+ floating emitter for MOS-gated controlled turn-on and a lateral P-channel MOSFET for shunting hole current in a second base region to a P+ diverting region electrically connected to the cathode. The P-channel MOSFET is enabled by the application of a negative gate voltage to form a P-type inversion layer between the second base region and the P+ diverter region, thus reducing the resistance between the cathode and the second base region and raising the holding current of the emitter switched thyristor to above the operating current level. The formation of an alternative current path to the cathode has the further effect of reducing the forward bias across the base-emitter junction of an adjacent parasitic thyristor to thereby prevent the sustained regenerative action of the parasitic thyristor.

12 Claims, 10 Drawing Sheets

OTHER PUBLICATIONS

FA-AS Baliga, "The MOS-Gated Emitter Switched Thyristor", IEEE Electron Device Letters (reprint), Vol. 11, No. 2, pp. 75-77, February, 1990.

FA-AT Nandakumar, Baliga, Shekar, Tandon and Reisman, "A New MOS-Gated Power Thyristor Structure with Turn-Off Achieved by Controlling the Base Resistance," IEEE Electron Letters, Vol. 12, No. 5, pp. 227-229, May, 1991.

FA-AR Shekar, Baliga, Nandakumar, Tandon and Reisman, "Characteristics of the Emitter-Switched Thyristor", IEEE Transactions on Electron Devices, Vol. 38, No. 7, pp. 1619-1623, July, 1991.

FA-AS Nandakumar, Baliga, Shekar, Tandon and Reisman, "The Base Resistance Controlled Thyristor (BRT) 'A New MOS Gated Power Thyristor'", IEEE, pp. 138-141, 1991.

FA-AT Shekar Baliga, Nandakumar, Tandon and Reisman, "Experimental Demonstration of the Emitter Switched Thyristor", pp. 128-131.

PA-AR Baliga, Adler, Gray and Love, "The Insulated Gate Rectifier (IGR): A New Power Switching Device," IEEE, IEDM-82, pp. 264-267, 1982.

FA-AS Temple, "MOS Controlled Thyristors (MCT'S), IEDM-84, pp. 282-285, 1984.

FA-AT Baliga, Adler, Love, Gray and Zommer, "The Insulated Gate Transistor: A New Three-Terminal MOS-Controlled Bipolar Power Device, IEEE Transactions on Electron Devices, Vol. ED-31, No. 6, pp. 821-828, June 1984.

UNIT CELL ARRANGEMENT FOR EMITTER SWITCHED THYRISTOR WITH BASE RESISTANCE CONTROL

FIELD OF THE INVENTION

The present invention relates to semiconductor switching devices, and more particularly to thyristors with MOS-gated control for preventing sustained parasitic latch-up.

BACKGROUND OF THE INVENTION

The development of semiconductor switching technology for high power applications in motor drive circuits, appliance controls and lighting ballasts, for example, began with the bipolar junction transistor. As the technology matured, bipolar devices became capable of handling very large current densities in the range of 200–300 A/cm$^2$, with blocking voltages of 600 V.

Despite the attractive power ratings achieved by bipolar transistors, there exist several fundamental drawbacks to the suitability of bipolar transistors for all high power applications. First of all, bipolar transistors are current controlled devices. Accordingly, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to breakdown if a high current and high voltage are simultaneously applied to the device, as commonly required in inductive power circuit applications, for example. Furthermore, it is difficult to parallel connect these devices since current diversion to a single device occurs at high temperatures, making emitter ballasting schemes necessary.

The power MOSFET was developed to address this base drive problem. In a power MOSFET, a bias voltage for turn-on and turn-off control is applied to a gate electrode. The gate electrode is separated from the device's active area by an intervening insulator, typically silicon dioxide. Because the gate is insulated from the active area, little if any gate current is required in either the on-state or off-state. The gate current is also kept small during switching because the gate forms a capacitor with the device's active area. Thus, only charging and discharging current ("displacement current") is required. The high input impedance of the gate, caused by the insulator, is a primary feature of the power MOSFET. Moreover, because of the minimal current demands on the gate, the gate drive circuitry and devices can be easily implemented on a single chip. As compared to bipolar technology, the simple gate control provides for a large reduction in cost and a significant improvement in reliability.

These benefits are offset, however, by the high on-resistance of the MOSFET's active region, which arises from the absence of minority carrier injection. Indeed, the drift region of the power MOSFET represents a high series resistance during current conduction. As a result, the device's operating forward current density is limited to relatively low values, typically in the range of 10 A/cm$^2$, for a 600 V device, as compared to 200–300 A cm$^2$, for the bipolar transistor.

On the basis of these features of power bipolar transistors and MOSFET devices, it is apparent that hybrid devices embodying a combination of bipolar current conduction with MOS-controlled current flow would provide significant advantages over single technologies such as bipolar or MOSFET alone. Thus, in the Insulated Gate Bipolar Transistor (IGBT), disclosed in an article by coinventor B. J. Baliga, M. S. Adler, R. P. Love, P. V. Gray and N. Zommer, entitled "*The Insulated Gate Transistor: A New Three terminal MOS Controlled Bipolar Power Device,*" IEEE Trans. Electron Devices, ED-31, pp. 821–828 (1984), on-state losses were shown to be greatly reduced when compared to power MOSFETs. This was caused by the conductivity modulation of the IGBT's drift region during the on-state. A cross-sectional representation of a typical insulated gate bipolar transistor is shown in FIG. 1.

Although gate-controlled bipolar transistors, such as the IGBT, represent an improvement over using bipolar or MOSFET devices alone, even lower conduction losses can be expected by using a thyristor. This is because thyristors offer a higher degree of conductivity modulation and a lower forward voltage drop when turned on. Consequently, the investigation of thyristors is of great interest so long as adequate methods for providing forced gate turn-off can also be developed. As will be understood by one skilled in the art, a thyristor in its simplest form comprises a four-layer P1-N1-P2-N2 device with three P-N junctions in series: J1, J2, and J3, respectively. The four layers correspond to the anode (P1), the first base region (N1), the second base or P-base region (P2) and the cathode (N2), respectively. In the forward blocking state, the anode is biased positive with respect to the cathode and junctions J1 and J3 are forward biased and J2 is reversed-biased. Most of the forward voltage drop occurs across the central junction J2. In the forward conducting state, all three junctions are forward biased and the voltage drop across the device is very low and approximately equal to the voltage drop across a single forward biased P-N junction.

An inherent limitation to the use of thyristors for high current applications is sustained latch-up, however, arising from the coupled P1-N1-P2 and N1-P2-N2 bipolar transistors which make up the four layers of the thyristor. This is because sustained thyristor latch-up can result in catastrophic device failure if the latched-up current is not otherwise sufficiently controlled by external circuitry or by reversing the anode potential. Sustained latch-up can occur, for example, when the summation of the current gains for the thyristor's regeneratively coupled P1-N1-P2 and wide base P1-N2-P2 transistors exceeds unity. An alternative to providing external circuitry or reversing the anode potential to obtain turn-off, however, is to use a MOS-gate for controlling turn-on and turn-off.

Several methods for obtaining MOS-gate control over thyristor action, including latch-up, exist. For example, in the MOS-controlled thyristor (MCT), turn-off is provided by shorting the emitter-base junction of the N-P-N transistor to thereby produce a reduction in gain. This raises the holding current of the thyristor to a level above the operating current. Accordingly, an MCT structure has been reported which utilizes an P-channel MOSFET integrated into the P-base region of a thyristor with a N$^-$ drift region, as shown in FIG. 2. This device is described in an article by V. A. K. Temple, entitled "*The MOS Controlled Thyristor,*" published in IEDM Technology Digest, Abstract 10.7, pp. 282–285, (1984). However, the maximum controllable current density, which is a direct measure of a device's ability to turn-off, is limited by the MOSFET inversion-layer channel resistance and other resistances in the base region. Because of the lower mobility for holes in silicon, MCT's built from n-type high-voltage drift layers exhibit poor current turn-off characteristics.

Other examples of MOS-gated thyristors include the depletion-mode thyristor (DMT), shown in FIG. 3, which overcame many of the drawbacks associated with the MCT. In the DMT, a depletion mode MOSFET is placed in series with the base of the P-N-P transistor. Accordingly, once the thyristor is turned-on, current flow can be shut off by application of a negative gate bias. This eliminates the base drive by pinching off the base current to the P-N-P transistor and shuts off the device. Both the MCT and DMT exhibit low forward drop and high on-state current densities.

In another device, described in an article entitled *"The MOS-Gated Emitter Switched Thyristor,"* by coinventor Baliga, published in IEEE Electron Device Letters, Vol. 11, No. 2, pp. 75-77, February, 1990, turn-on is achieved by forcing the thyristor current to flow through an N-channel MOSFET and floating N+ emitter integrated within the P-base region. This article is hereby herein incorporated by reference. A cross-sectional representation of this structure and equivalent circuit is shown in FIGS. 4A and 4B, which are reproductions of FIG. 1 from the aforesaid Baliga article. As will be understood by one skilled in the art, the length of the floating N+ emitter region, which determines the value of large resistance R shown in FIG. 4B, controls the holding and triggering current for the device. Turn-off of the emitter switched device (EST) is accomplished by reducing the gate voltage on the MOSFET to below the threshold voltage. This cuts off the floating N+ region from the cathode and shuts-off the device.

Unfortunately, the integration of the MOSFET into the P-base region causes a parasitic thyristor to be formed, as shown in FIG. 4A. The N+ emitter region of the parasitic thyristor forms the N+ source of the N-channel MOSFET. If this thyristor turns-on, the EST can no longer be turned off by reducing the MOSFET gate voltage to zero. Turn-on of the parasitic thyristor is initiated by the onset of electron injection from the N+ emitter region of the parasitic thyristor when forward biased, and is dictated by the resistance of the P-base under the N+ emitter region. Accordingly, the likelihood that parasitic latch-up will occur can be reduced if the P-base resistance (small R) is lowered by making the length of the N+ emitter region small and by using a P+ diffusion to reduce the sheet resistance of the P-base.

More recently, a base resistance controlled thyristor (BRT) was described in U.S. Pat. No. 5,099,300, to Baliga, and an article entitled *"A New MOS-Gated Power Thyristor Structure with Turn-Off Achieved by Controlling the Base Resistance,"* by coinventors M. Nandakumar, B. J. Baliga and M. Shekar, and S. Tandon and A. Reisman, IEEE Electron Device Leeters, Vol. 12, No. 5, pp. 227-229, (1991), both of which are hereby incorporated herein by reference. The principle of operation involves modulation of the lateral P-base resistance of the thyristor using MOS gate control. Operational BRTs with 600-volt forward blocking capability, such as the one shown in FIG. 5, have been developed. FIG. 5 is a reproduction of FIG. 1 from the aforesaid Nandakumar, et al. article. The BRT can be turned-off by application of a negative bias to a diverting means to thereby reduce the resistance of the P-base by providing a parallel path for current flow to the cathode. As will be understood by one skilled in the art, the reduction in P-base resistance results in an increase in the device's holding current to above the operational current level and shuts-off the device.

There are certain advantages that EST devices shown in FIG. 4a have over MOS-controlled thyrisior (MCT) structures. First, the EST device can be fabricated using an IGBT baseline process which is much simpler than the triple-diffused DMOS process used to fabricate the MCT, for example. In addition, unlike the MCT, saturation of the thyristor current through gate control is possible with the EST structure. This feature provides controlled turn-on of the EST for adjusting the rate of rise of the anode current. This characteristic enhances the EST's suitability for motor drive applications for controlling the recovery of flyback diodes, for example. In addition, the EST is characterized by high input impedance, low on-state voltage drop, and good turn-off characteristics, which makes it useful for other applications in motor drive circuits, appliance controls, and lighting ballasts, to name a few.

One of the inherent disadvantages of using an EST, however, is the parasitic thyristor shown schematically on the right hand side of FIG. 4B. This parasitic thyristor can latch-up at high current densities resulting in a loss of MOS-gated control. As will be understood by one skilled in the art, the presence of the P+ diffusion in the P-base reduces the likelihood of latch-up by keeping the resistance under the N+ emitter of the parasitic thyristor as small as possible. This reduces the likelihood that the P+/N+ junction will become forward biased when the thyristor is turned-on. The injection of electrons from the N+ emitter can also be limited by shorting the P+ diffusion to the cathode, as shown. Notwithstanding these techniques to prevent latch-up, however, a multicell EST switching device rated for 1 amp has been shown to be susceptible to parasitic latch-up failure at about 2.5 amps for a gate voltage of 10 volts for a 600 volt device. This low latch-up level limits the suitability of using emitter switched devices for higher current applications.

SUMMARY OF THE INVENTION

It is therefore an object of the present invention to provide a semiconductor switching device with high input impedance, low on-state voltage drop and controlled turn-on and turn-off characteristics.

It is another object of the present invention to provide a semiconductor switching device having low susceptibility to parasitic latch-up at even high current densities.

These and other objects are provided, according to the present invention, by an emitter switched thyristor with base resistance control for increasing the turn-off speed and preventing sustained parasitic latch-up under transient conditions. An emitter switched thyristor of the present invention prevents sustained latch-up by selectively removing the electrical connection between the cathode and the first base region using a gating means, and simultaneously reducing the resistance of the second base region using a diverting means.

In particular, an emitter switched thyristor of the present invention comprises a main thyristor with an N+ floating emitter in the second base region. When the gating means is enabled by a positive gate bias, the floating emitter becomes electrically connected to the cathode and the first base region. This has the effect of turning on the thyristor by providing electron current flow from the cathode to the first base region via the gating means. The flow of electron current provides the base current drive for the P1-N1-P2 transistor and causes latch-up of the regeneratively coupled P1-N1-P2 and N1-P2-N2 transistors in the main thyristor portion of the device, under certain operating conditions.

According to one aspect of the present invention, turn-off of the device is provided by disabling the gating means to remove the electrical connection between the cathode and the first base region and by enabling the diverting means. In the preferred embodiment, the diverting means comprises a P-channel MOSFET enabled by a negative gate bias and a low resistivity P-type diverter region electrically connected to the cathode. When the diverting means is enabled, holes in the second base region are shunted to the cathode via the diverting region. The shunting effect provided by the diverting means also limits the number of holes flowing under the N+ emitter of the parasitic thyristor and to the cathode via the P+ diffusion in the second base region. This causes an increase in the holding current level to above the operating current of the device and provides turn-off of the main thyristor and parasitic thyristor.

The diverting means also provides additional advantages. In particular, the diverting means provides the capability of turning off the parasitic thyristor located between the anode and cathode adjacent the main thyristor, to thereby prevent dynamic parasitic latch-up which can occur during switching from the on-state to off-state. As will be understood by one skilled in the art, the parasitic thyristor may not be controllable by the gating means alone. Accordingly, the diverting means reduces the resistance of the second base region by creating a parallel electrical connection to the cathode, thereby shunting hole current to the cathode to prevent sustained latch-up of the parasitic thyristor.

DESCRIPTION OF A PREFERRED EMBODIMENT

The present invention will now be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
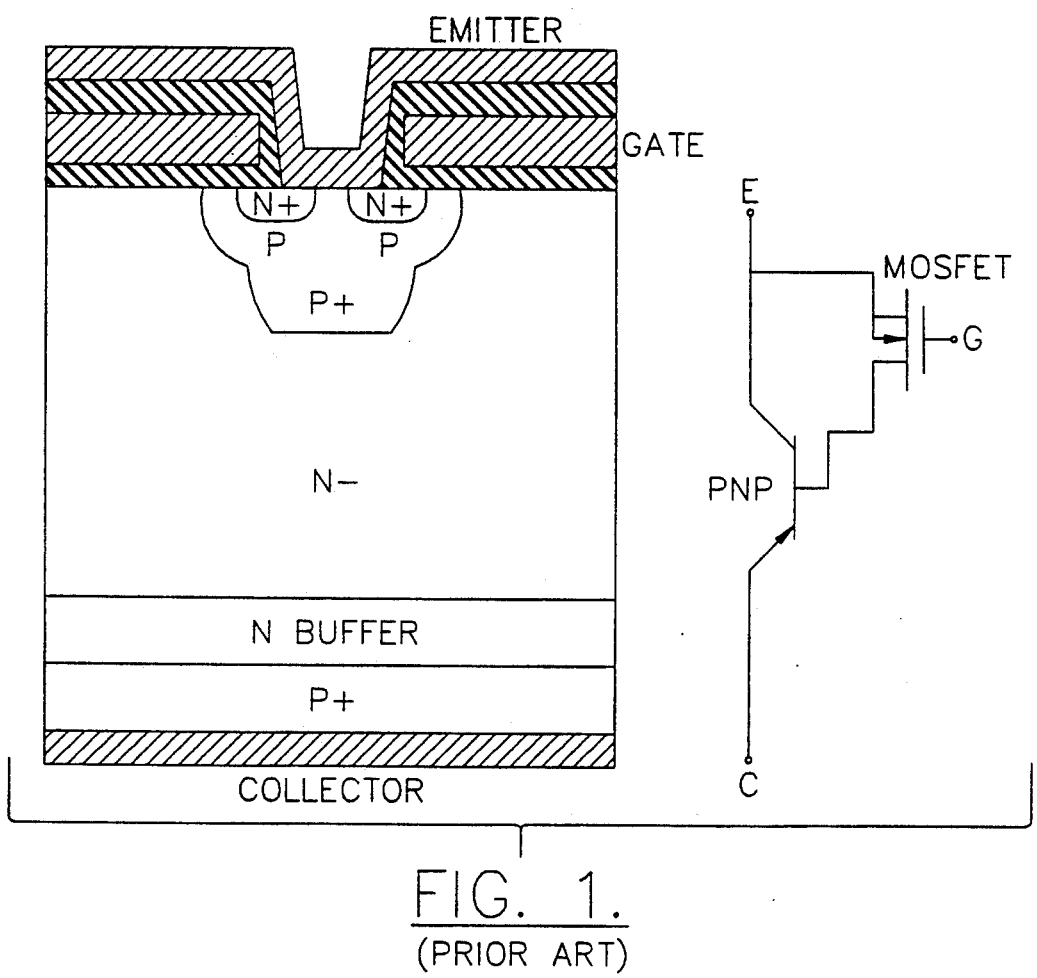
FIG. 1 illustrates a cross-sectional representation of a prior art Insulated Gate Bipolar Transistor (IGBT).
Figure 2:
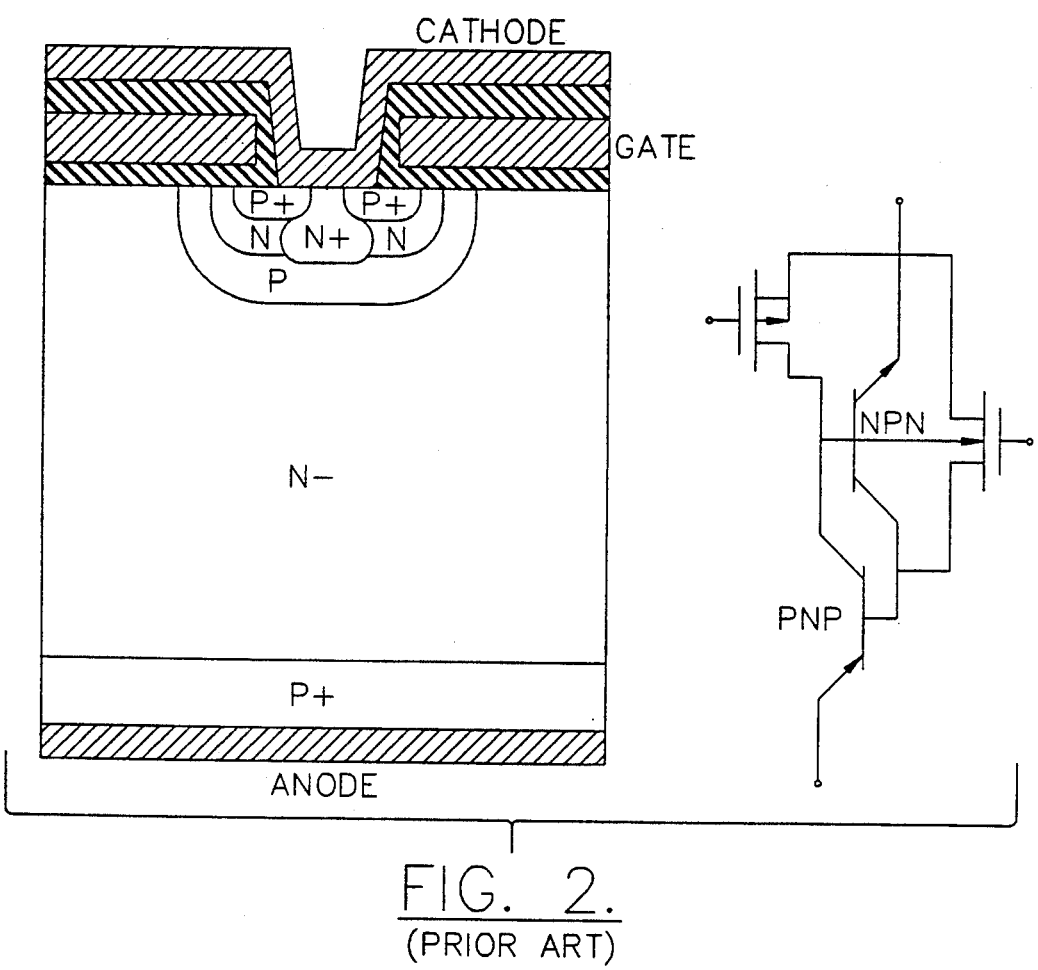
FIG. 2 illustrates a cross-sectional representation of a prior art MOS-Controlled Thyristor (MCT).
Figure 3:
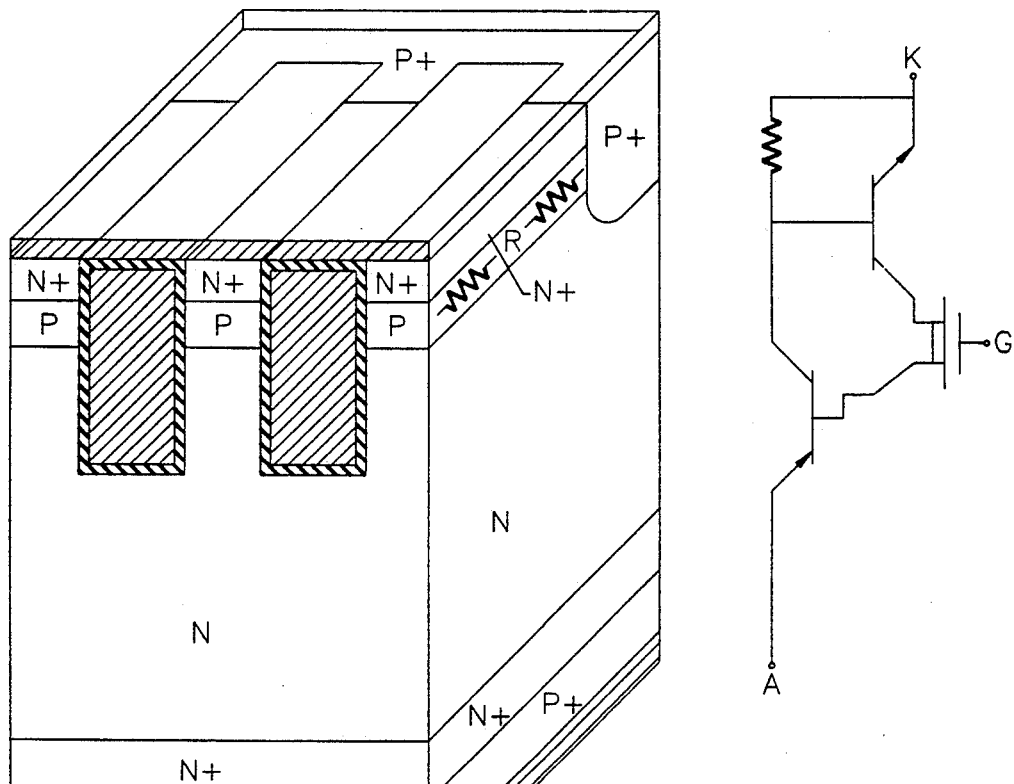
FIG. 3 illustrates a cross-sectional representation of a prior art Depletion Mode Thyristor (DMT).
Figure 4A:
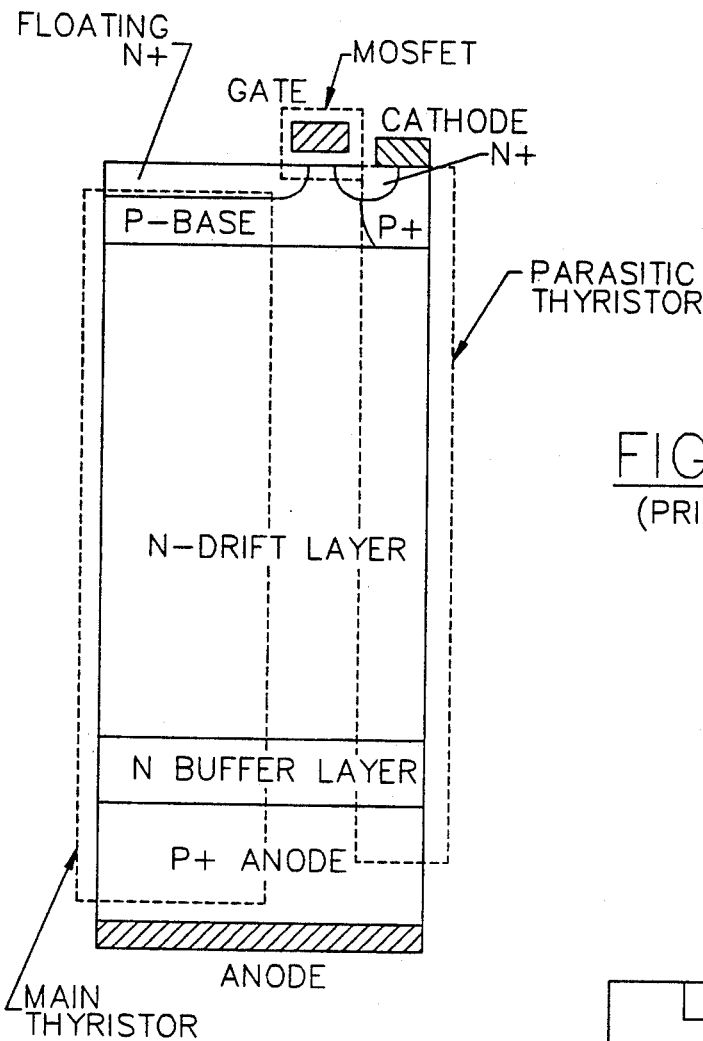
FIG. 4A illustrates a cross-sectional representation of a prior art Emitter Switched Thyristor (EST).
Figure 4B:
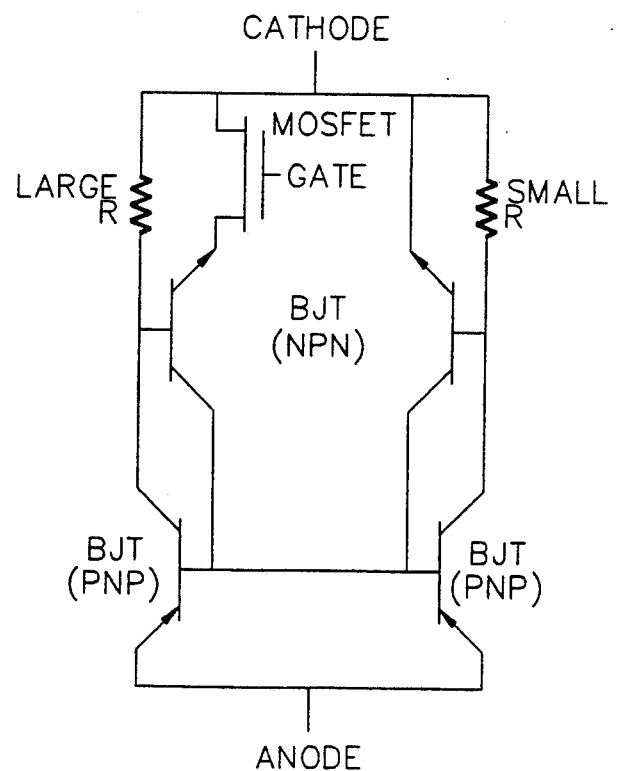
FIG. 4B illustrates an equivalent electrical circuit schematic for the EST shown in FIG. 4A.
Figure 5:
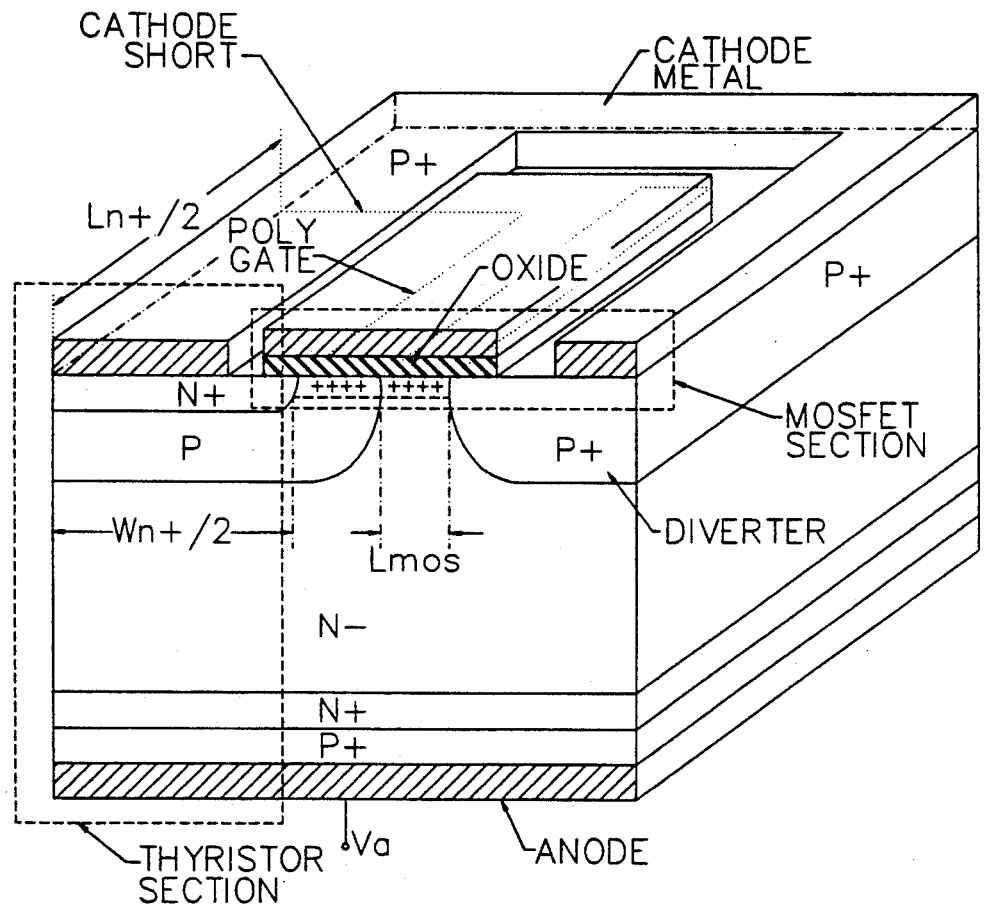
FIG. 5 illustrates a three-dimensional cross-sectional representation of a prior art Base Resistance Controlled Thyristor (BRT).
Figure 6A:
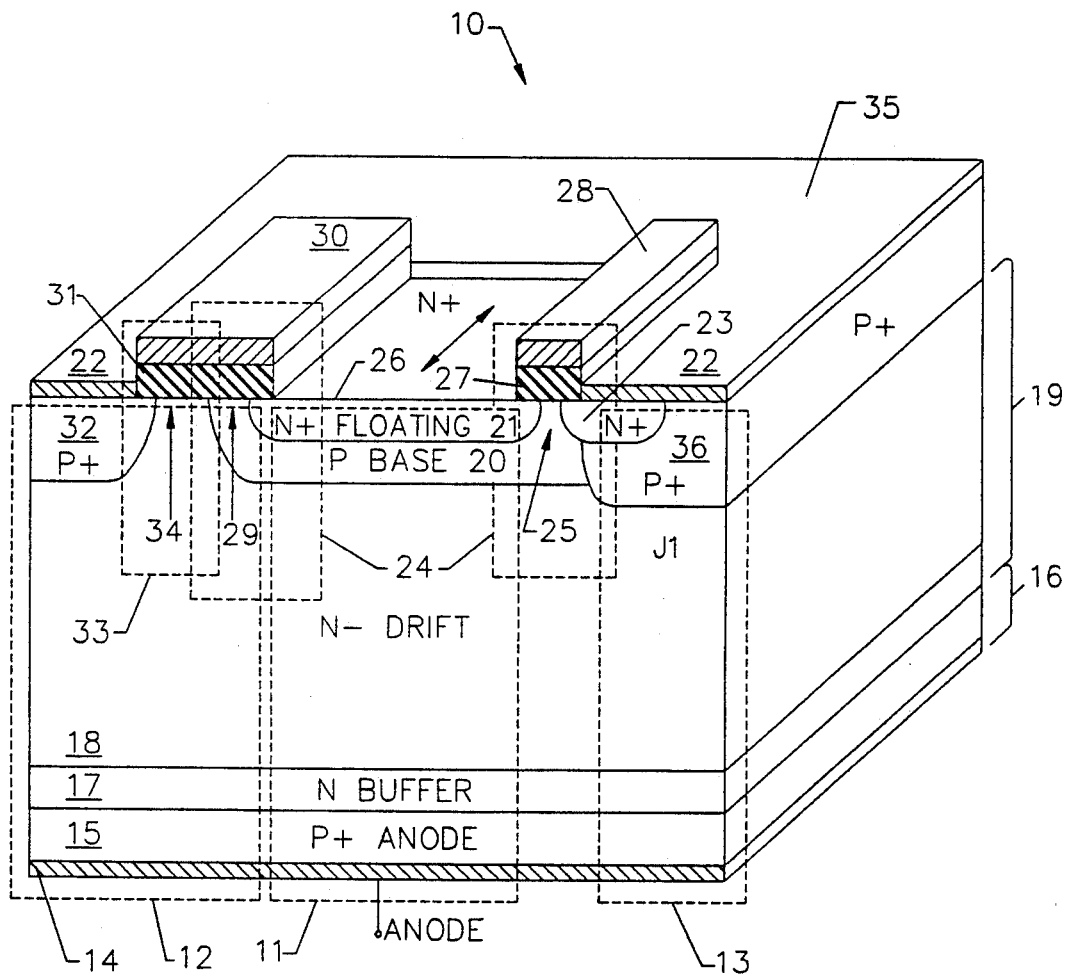
FIG. 6A illustrates a cross-sectional representation of an Emitter Switched Thyristor (EST), according to the present invention.

Referring now to FIG. 6A, a three-dimensional representation of the Emitter Switched Thyristor (EST) 10 according to the present invention is shown. The thyristor 10 comprises three portions: the main thyristor 11, the BRT 12 and the parasitic thyristor 13, as shown. The main thyristor 11 includes: an anode metallization layer 14 and P+ anode layer 15 which collectively comprise the anode 16; an N-type buffer layer 17 and N− drift region 18 which collectively comprise the first base region 19; a P-base or second base region 20; and an N+ floating emitter 21. The cathode contact 22 and N+ emitter 23 collectively comprise the cathode 35, which together with the main thyristor 11 form an EST structure.

A gating means 24 is also provided for selectively connecting the N+ emitter 23 to the first base region 19 to turn-on the main thyristor 11. The gating means 24 preferably comprises a first field effect transistor 25 between the floating emitter 21 and the N+ emitter 23, at the semiconductor surface 26. The first field effect transistor 25 is preferably an N-channel MOSFET with insulating layer 27 on surface 26 and gate 28. When a positive bias is applied to the gating means 24 at gate 28, an N-type channel is formed at surface 26 in the P-base region 20. This channel electrically connects the N+ emitter 23 to the floating emitter 21. Accordingly, the N+ emitter 23 comprises the N+ source of the first field effect transistor 25. The gating means 24 also includes a second field effect transistor 29 for providing an electrical connection between the floating emitter 21 and the N− drift region 18 when a positive bias is applied to gate 30 on top of the gate insulating layer 31.

A P+ diverter region 32 is also provided adjacent the P-base 20. The diverter region 32 provides a high conductivity path to the cathode contact 22 when the diverting means 33 is activated. The diverting means preferably comprises a P-channel field effect transistor 34, having a gate 30 and insulating layer 31 on surface 26. When the diverting means is enabled by the application of a negative bias to gate 30, a P-channel is set up at the surface 26 in drift region 18. This P-channel provides a low resistance path between the P-base 20 and diverter region 32 and shunts hole current from the P-base 20 to the cathode contact 22.

Figure 8:
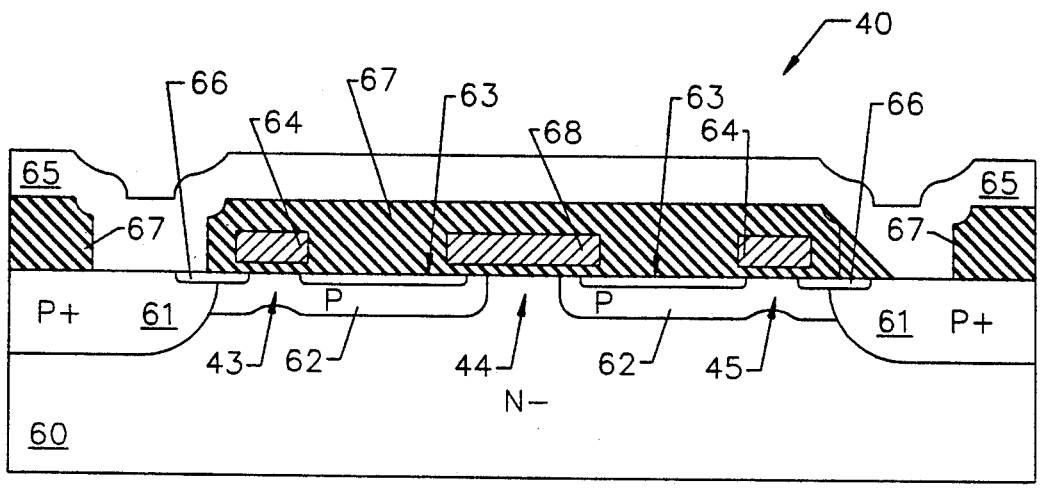
FIG. 8 illustrates a cross-sectional representation for the EST of FIG. 7, taken along line A—A'.
Figure 9:
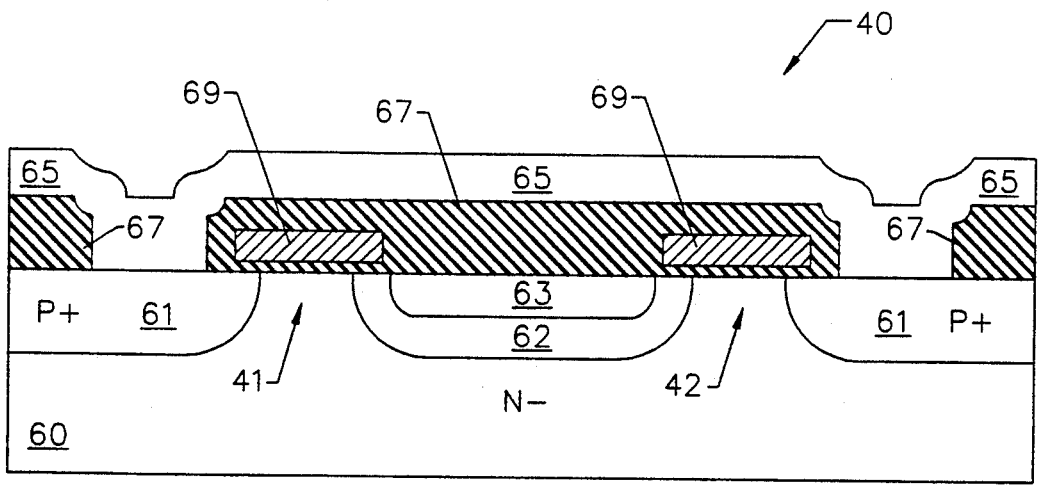
FIG. 9 illustrates a cross-sectional representation for the EST of FIG. 7, taken along line B—B'.

As will be understood by one skilled in the art, the shunting of hole current through diverter region 32 reduces the forward bias across the P+/N+ junction defined by the intersection of the regions 36 and 23 and prevents the parasitic thyristor from entering a sustained latch-up mode of operation. The P+0 region 36 together with emitter 23 and regions 19 and 16 form the parasitic thyristor 13. Although, the P+ diverter region 32 and region 36 are described as distinct regions for purposes of explaining the operation of the thyristor, typically they will comprise a single P+ region as shown in FIGS. 7-9, described below.

Figure 6B:
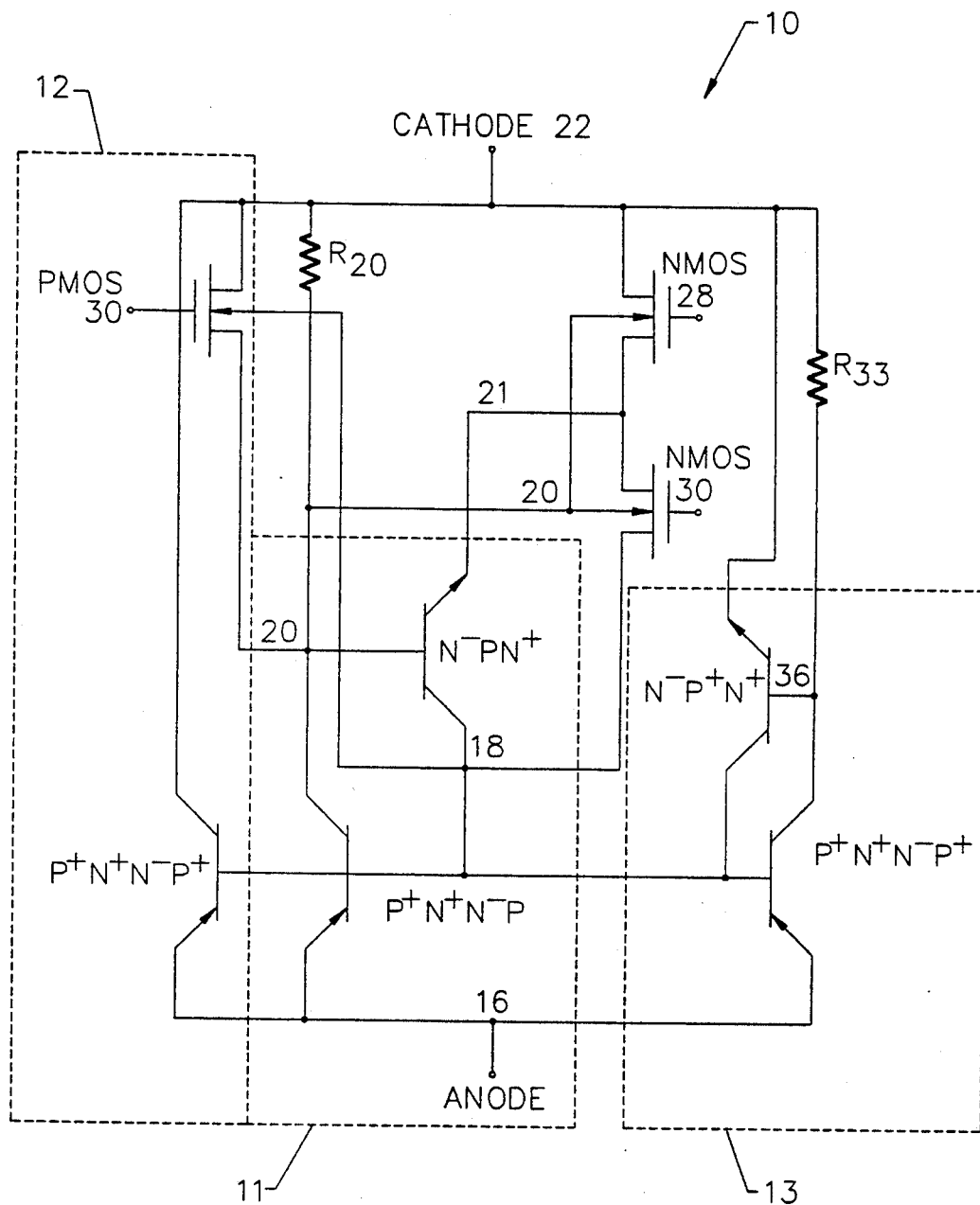
FIG. 6B illustrates an equivalent electrical circuit schematic for the thyristor shown in FIG. 6A.

Referring now to FIG. 6B, an equivalent circuit schematic for the emitter switched thyristor of FIG. 6A is provided. The circuit nodes are numbered to correspond with the regions shown in FIG. 6A. It is important to note that the values $R_{20}$ and $R_{36}$ shown in FIG. 6B represent the resistance of the second base region or P-base 20 and the P+ region 36, respectively.

Figure 7:
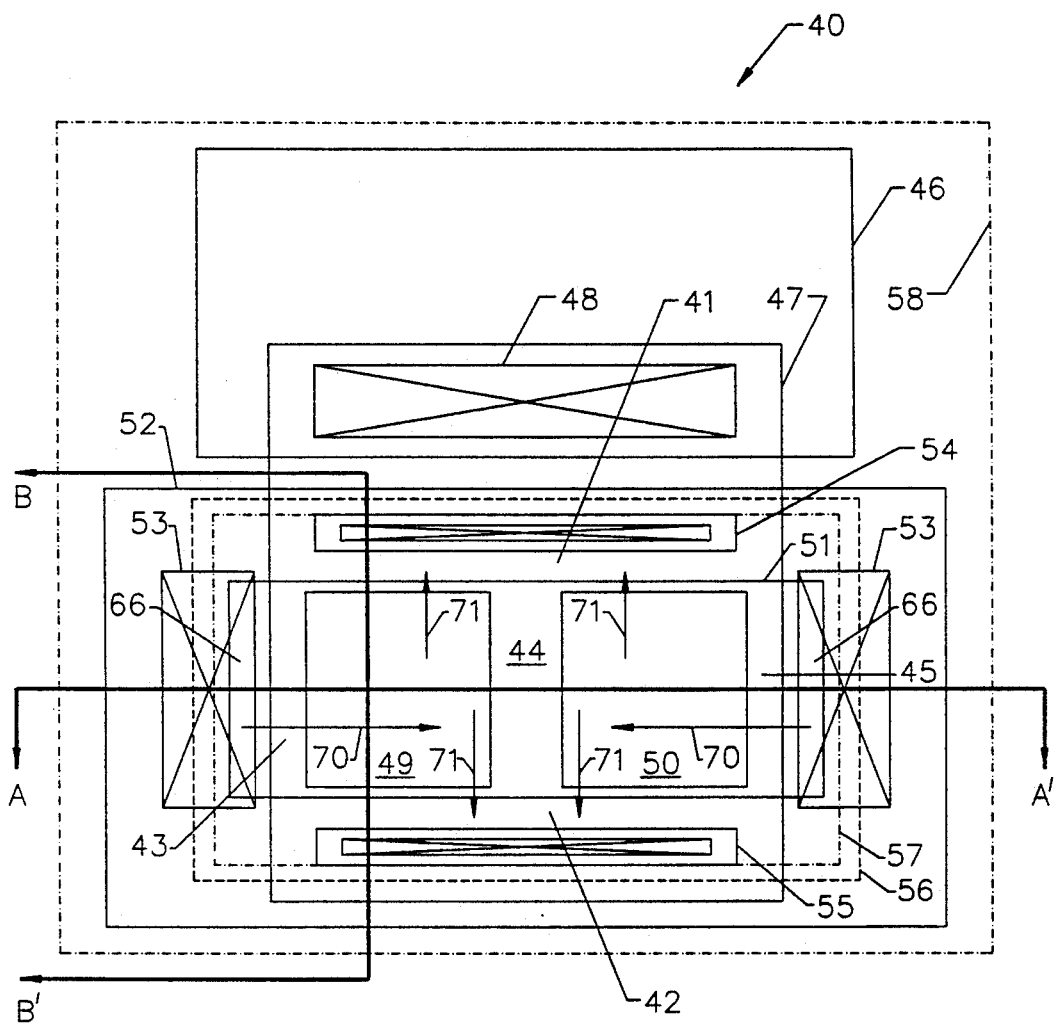
FIG. 7 illustrates a unit cell layout of an Emitter Switched Thyristor (EST) according to present invention, having a diverting means positioned orthogonal with respect to the gating means.

Referring now to FIG. 7, a unit cell layout of an emitter switched thyristor according to the present invention is shown wherein solid and dotted lines are used to define the masking areas for the lithographic portion of the process. Unlike the EST of FIG. 6A, the unit cell 40 is a combination of two EST devices positioned back to back. Moreover, the diverting means comprises two P-channel MOSFETs 41 and 42 positioned in orthogonal relation to the gating means. The gating means comprises three (3) N-channel MOSFETs, 43, 44, and 45. Contact to the gating means is provided by a gate pad and gate, defined by regions 46 and 47, respectively. These regions are electrically connected together by the gate contact defined by region 48. The two floating emitters are also defined by regions 40 and 50. The N+ emitter of the parasitic thyristor is defined by region 51, however, during processing, the actual N+ emitter regions 66 will be confined to the portion of region 51 outside region 47. This is because during processing, the gate region 47 of the N-channel MOSFETs 43 and 45 acts as a mask to the subsequently formed N+ emitter regions 66. The N+ emitter regions 66 are electrically connected to the cathode metal 52 by contacts 53. The P-channel MOSFETS are similarly connected to the cathode metal 52 by contacts 54 and 55. As will be understood by one skilled in the art, the active area for the unit cell is defined by the region 56, and the P+ region is defined within edge 57 and 58.

Accordingly, when a positive bias is applied to thereby enable the gating means, an N-type inversion layer is formed in each of the N-channel transistors 43, 44, 45 and an electrical connection is provided between the cathode metal 52 and the first base region, not shown. Given the orientation of the regions shown in FIG. 7, the enablement of the gating means would cause an electron current to flow in the direction shown symbolically by arrows 70.

Similarly, when a negative bias is applied to thereby enable the diverting means, a hole current is set-up between the P-base region and the cathode metal 52 via contacts 54 and 55. The hole current, shown symbolically by arrows 71, flows in a direction orthogonal to the direction of the electron current flow 70.

Referring now to FIG. 8, a cross-sectional representation for the EST unit cell of FIG. 7, taken along line A—A', is shown. For illustration purposes only, the anode layer has been omitted. The unit cell 40 comprising two back to back EST devices is shown with a first base region 60, P+ region 61, second base regions 62, N+ emitter regions 66, and floating N+ emitter regions 63. The N-channel MOSFETs for the gating means include gates 64 and 68, within the gate insulating layer 67. The cathode metal is provided by a layer of metallization 65. Accordingly, when a positive bias is applied to gates 64 and 68, N-type inversion layers are formed at the surface of the second base regions 62, thereby electrically connecting the N+ emitter regions 66, the floating N+ emitters 63, and the first base region 60.

Referring now to FIG. 9, a cross-sectional representation for the EST unit cell of FIG. 7, taken along line B—B', is shown. The unit cell 40 further comprises a diverting means having P-channel MOSFETs 41 and 42. When a negative bias is applied to gates 69, the diverting means is enabled by the formation of a P-channel inversion layer between the P-base region 62 and P+ diverter region 61, to thereby shunt hole current to the cathode contact 65 and turn-off the device.

Figure 10:
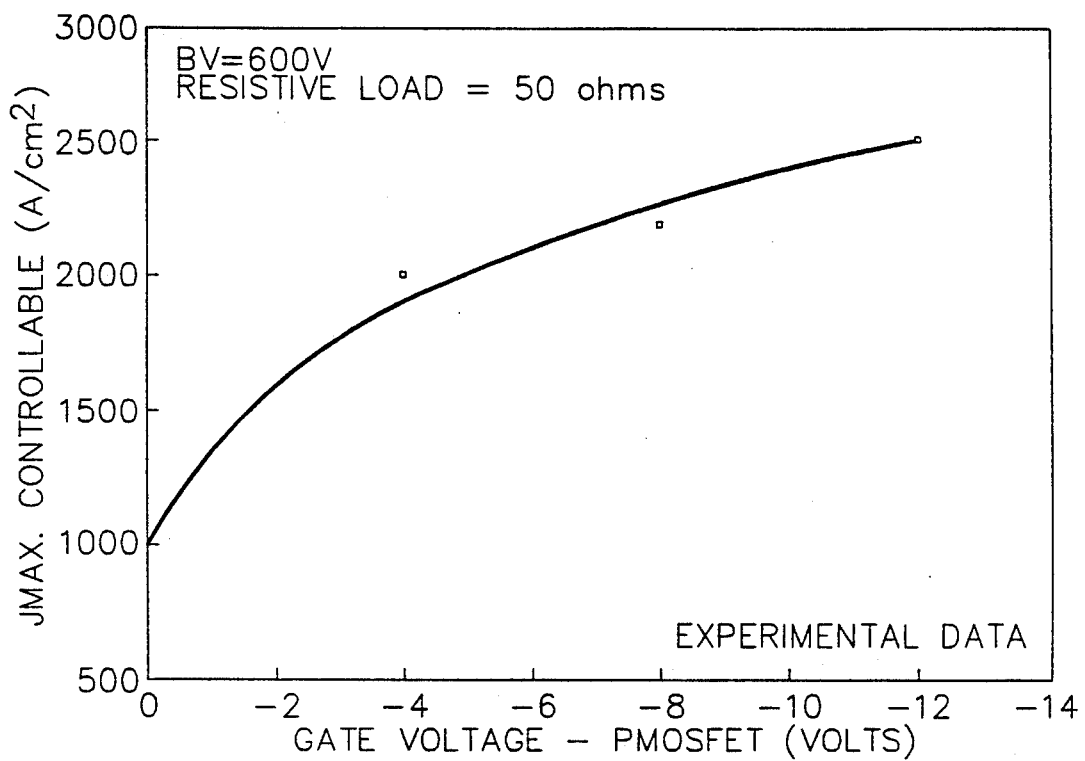
FIG. 10 shows the variation in Maximum Controllable Current Density as a function of the diverting means bias voltage for an emitter switched thyristor having the orthogonal diverting means orientation shown in FIG. 7.

Referring now to FIG. 10, a graph of the measured Maximum Controllable Current Density, as a function of diverting means bias voltage, is provided for the EST unit cell of FIG. 7. The unit cell has a forward blocking voltage of 600 Volts. As shown by the graph, current densities up to about 2600 A/cm$^2$ ($V_g = -12$ Volts) can be turned off by enabling the diverting means with a negative bias.

Accordingly, as shown by FIG. 6A, the emitter switched thyristor of the present invention comprises a main thyristor having an anode 16, first base region 19, second base region 20 and floating emitter 21. A gating means 24 is provided for turning on and turning off the main thyristor. In addition, a diverting means is further provided for shunting the second base region 20 to the cathode 35 via the diverter region 32, to thereby suppress forward conduction of both the main thyristor 11 and parasitic thyristor 13. Accordingly, whereas sustained parasitic latch-up may occur at a given current density in a conventional EST device, the EST according to the present invention is less susceptible to sustained latch-up of the parasitic thyristor because of the base resistance control provided by the diverting means.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor switching device comprising:
   a semiconductor substrate having a face;
   a first thyristor in said semiconductor substrate, said first thyristor comprising an anode, a first base region of first conductivity type on said anode and extending to said face, a second base region of second conductivity type, opposite said first conductivity type, in said first base region at said face, and a first floating emitter region of first conductivity type in said second base region at said face;
   a first emitter region of first conductivity type in said semiconductor substrate at said face, adjacent said first floating emitter region;
   a second thyristor in said semiconductor substrate, adjacent said first thyristor, said second thyristor comprising said anode, said first base region, a third base region of second conductivity type in said first base region at said face and adjacent said second base region, and a second floating emitter region of first conductivity type in said third base region at said face;
   a second emitter region of first conductivity type in said semiconductor substrate at said face, adjacent said second floating emitter region;

first gating means at said face, between said second base region and said third base region, for electrically connecting said first floating emitter region and said second floating emitter region to said first base region in response to a first bias signal;

second gating means at said face, between said first floating emitter region and said first emitter region, for electrically connecting said first emitter region to said first floating emitter region, to thereby provide electron conduction between said first emitter region and said first floating emitter region in a first direction, in response to said first bias signal;

third gating means at said face, between said second floating emitter region and said second emitter region, for electrically connecting said second emitter region to said second floating emitter region, to thereby provide electron conduction between said second emitter region and said second floating emitter region in a second direction, opposite said first direction, in response to said first bias signal;

a diverter region of second conductivity type in said semiconductor substrate at said face;

diverting means for electrically connecting said second base region and said third base region to said diverter region in response to a second bias signal, to thereby provide hole conduction between said second and third base regions and said diverter region in a third direction, orthogonal to said first and said second directions.

2. The semiconductor switching device of claim 1, wherein said first gating means comprises an enhancement mode filed effect transistor of first channel type having an active region in said second base region, between said first floating emitter region and said first base region and an enhancement mode field effect transistor of first conductivity type having an active region in said third base region, between said second floating emitter region and said first base region.

3. The semiconductor switching device of claim 2, wherein said second gating means comprises an enhancement mode field effect transistor of first channel type having an active region in said second base region, between said first floating emitter region and said first emitter region and wherein said third gating means comprises an enhancement mode field effect transistor of first channel type having an active region in said third base region, between said second floating emitter region and said second emitter region.

4. The semiconductor switching device of claim 3, wherein said diverting means comprises an enhancement mode field effect transistor of second channel type having an active region in said first base region, between both said second and said third base regions and said diverter region.

5. The semiconductor switching device of claim 4, further comprising a cathode contact, electrically contacting said diverter region, said first emitter region and said second emitter region.

6. The semiconductor switching device of claim 5, wherein the gate electrodes of said enhancement mode transistors of first and second channel type are electrically connected.

7. A semiconductor switching device comprising:
a semiconductor substrate having a face;
a thyristor in said semiconductor substrate, said thyristor comprising an anode, a first base region of first conductivity type on said anode, a second base region of second conductivity type, opposite said first conductivity type, in said first base region, a third base region of second conductivity type in said first base region, a first floating emitter region of first conductivity type in said second base region, a second floating emitter region of first conductivity type in said third base region;

a first emitter region of first conductivity type in said semiconductor substrate at said face, said first emitter region forming a p-n junction with said second base region;

a second emitter region of first conductivity type in said semiconductor substrate at said face, said second emitter region forming a p-n junction with said third base region;

a diverter region of second conductivity type in said semiconductor substrate;

diverting means, in said semiconductor substrate, for electrically connecting said second base region and said third base region to said diverter region in response to a first bias signal, to thereby provide hole conduction between said second and third base regions and said diverter region in a first direction;

turn-on gating means, in said semiconductor substrate, for electrically connecting said first emitter region to said first base region and for electrically connecting said second emitter region to said first base region, so that electron conduction occurs in opposing directions, orthogonal to said first direction, in said first floating emitter region and said second floating emitter region, respectively, in response to a second bias signal.

8. The semiconductor switching device of claim 7, wherein said diverting means and said turn-on gating means comprise enhancement mode field effect transistors.

9. The semiconductor switching device of claim 8, wherein the gate electrodes of said enhancement mode field transistors are electrically connected.

10. The semiconductor switching device of claim 7, wherein said diverter region contacts said first emitter region and said second emitter region and forms an p-n junction therewith.

11. The semiconductor switching device of claim 10, further comprising a cathode contact, electrically contacting said first emitter region, said second emitter region and said diverter region.

12. The semiconductor switching device of claim 8, wherein said enhancement mode field effect transistors comprise MOSFETs.

* * * * *